(12) United States Patent
Laschinski

(10) Patent No.: US 6,467,163 B1
(45) Date of Patent: *Oct. 22, 2002

(54) UNIVERSAL COMPONENT MOUNTING STRUCTURE FOR SURFACE MOUNTABLE ELECTRONIC DEVICES

(76) Inventor: Robert A. Laschinski, 1275 Windjammer La., Hanover Park, IL (US) 60103

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 795 days.

(21) Appl. No.: 08/746,650

(22) Filed: Apr. 3, 1997

Related U.S. Application Data

(63) Continuation of application No. 08/303,588, filed on Sep. 9, 1994, now abandoned, and a continuation of application No. 07/923,346, filed on Aug. 3, 1992.

(51) Int. Cl.[7] .................................................. H05K 3/30
(52) U.S. Cl. ............................. 29/836; 29/832; 29/834
(58) Field of Search .......................... 29/832, 834, 836, 29/837

(56) References Cited

U.S. PATENT DOCUMENTS

| | | | | |
|---|---|---|---|---|
| 4,872,261 A | * | 10/1989 | Sanyal et al. | 29/840 |
| 4,885,841 A | * | 12/1989 | McNabb | 29/840 X |
| 4,926,546 A | * | 5/1990 | Polczynski et al. | 29/840 |
| 4,934,943 A | * | 6/1990 | Klein et al. | 29/840 X |
| 5,102,831 A | * | 4/1992 | Haga | 29/840 |
| 5,208,976 A | * | 5/1993 | Bess et al. | 29/740 X |
| 5,323,532 A | * | 6/1994 | Schmidt et al. | 29/832 X |
| 5,349,747 A | * | 9/1994 | Dennis | 29/832 X |

\* cited by examiner

*Primary Examiner*—R. Chang
(74) *Attorney, Agent, or Firm*—Robert L. Marsh

(57) ABSTRACT

A universal mounting structure for surface mountable electronic devices is provided having an arrangement of circuit patterns or lands applied to a circuit board or circuit waffer that permits the mounting of surface mount electronic devices of various sizes or mounting footprint requirements and that provides multiple placement location and interconnection options for the components to the circuit designer. The universal mounting structure described above provides a breadboard or prototyping medium for use with surface mount devices.

6 Claims, 3 Drawing Sheets

UNIVERSAL COMPONENT MOUNTING STRUCTURE FOR SURFACE MOUNTABLE ELECTRONIC DEVICES

The present application is a continuation of the applicants previous application Ser. No. 07/923,346 filed Aug. 3, 1992, and application Ser. No. 08/303,588 filed Sep. 9, 1994 now abandoned.

The present invention relates in general to printed circuit "breadboard" assemblies using surface mount type components and more particularly to the use of a universal mounting structure or circuit pattern that will allow for the placement of a variety or range of different types, styles, and sizes of surface mountable components and which also allows for multiple component placement location options on the same structure.

BACKGROUND OF THE INVENTION

In the electronic circuit design field it is common practice to build a test or prototype circuit using components that are "breadboarded" or interconnected in a circuit configuration determined by the circuit designer whereby the circuit function can be observed, tested, and evaluated.

On occasion when circuits will be prototyped or breadboarded using components that have leads, wires, pins, or other means of interconnection intended for mounting in holes, a common practice would be to use one of the many breadboards or prototyping boards available for this purpose. When the circuit designer wishes to use components intended for surface mounting when prototyping a given circuit design they usually must develop a custom circuit board pad and conductor pattern dedicated to a particular requirement because surface mount components do not have lead structures that can be fashioned in a way that will allow them to be interconnected or mounted to a typical breadboard intended for leaded components. When circuit designers do develop, dedicated custom mounting pad and circuit pattern for their application they usually use industry standard mounting pads or "footprints" for the individual devices used.

Circuit designers have long needed a breadboarding medium for use with surface mount components that will allow for the use of many different component types, styles, and sizes, and that will also allow for many different component mounting location and interconnection configurations. Such a medium would preferably allow the circuit designer to select from a range of components "footprints" to work with, and allow the use of components with two or more terminals or connection points. The present invention fulfills this need.

The universal interconnection structure for microelectronic devices of Rotast U.S. Pat. No. 3,716,761, and the universal leadless chip carrier mounting pad of Daberkoe U.S. Pat. No. 4,489,365 address only the mounting of various surface mount integrated circuits but do not provide for the mounting of discrete surface mount components such as resistors, capacitors, diodes, transistors and other surface mount devices. The above mentioned references are not really within the same scope as the present invention in that they can be utilized for the mounting or breadbording of an entirely different family of devices comprised of many types of surface mount devices other than integrated circuits and with the principle utility being different in nature than the above mentioned invention.

The electronic component mounting wafers for repeated connection in a variety of circuit designs by Christiansen U.S. Pat. No. 3,833,838 does provide a useful means of connecting components with leads but does not address the needs of surface mount applications in that the designs and patterns are not intended for surface mount devices and have little utility for their application, and with the main goal of the above invention being heat isolation and reusable mounting wafers for use with leaded components.

Whatever the precise merits, features, and advantages of the above cited references, none of them achieves or fulfills the purpose of the present invention, the universal component mounting structure for surface mountable electronic devices.

SUMMARY OF THE INVENTION

It is the purpose of the present invention to provide circuit designers with the means to develop and test circuits using surface mount electronic devices without the need to design and produce custom patterns for dedicated circuit boards, and to facilitate the testing of individual components or groups of components in an efficient fashion. The present invention fulfills the above mentioned purpose by providing conductive circuit patterns of lands that provide multiple areas on the same structure for mounting several components of differing sizes, with the above mentioned circuit patterns or lands being arranged with conductor and insulator patterns that provide multiple component mounting footprints that do not conform to industry standard footprint specifications, but are universal in nature.

Furthermore the present invention can be utilized to produce many different surface mount based circuit designs in production quantities if so desired as the potential benefits of the present invention are not necessarily limited to prototyping or breadboarding exclusively.

The universal component mounting structure for surface mountable electronic devices described herein when used alone in the form of an individual circuit board or circuit wafer provides a convenient means for circuit designers to breadboard with surface mount devices. The present invention can also be utilized on the same circuit board with custom or dedicated circuit patterns to provide for a breadboarding, prototyping, or circuit modification area in adjunct to the dedicated circuit patterns. The present invention can also be utilized on the same circuit board with industry standard mounting footprints for integrated circuits and other devices using both surface mount and leaded technologies in order to provide a surface mount breadboarding area in adjunct to those components.

The present invention is comprised of electrically conductive circuit patterns or lands spaced by or applied to an insulating material or substrate. The dimensions of the circuit patterns or lands and the insulating gaps or spaces between the lands are designed so that the required mounting footprints for a range of surface mount device sizes will be available for mounting of a given component, with the size and location of the component being determined by the circuit designer. The present invention does not require a fixed method to determine the dimensions of the lands and spaces for each design since it is the goal of the present invention to provide a range of differing patterns, each being suitable for a given family of component types or size ranges on a common structure. The only requirement is that the minimum and maximum widths or lengths of the desired range of mounting footprints to provided for. A typical footprint for a two terminal surface mount device would be comprised of two conductive attachment points spaced by an insulating area. For example, a few industry standard sizes for surface mount resistors and capacitors are commonly know as 805,1206, and 1210, the sizes being 0.080×0.050 in., and 0.120×0.060 in., and 0.120×0.100 in. respectively. The terminations or connection points on these examples are on the ends of the longer axis. For a universal mounting pattern to accommodate placement of any one of these example devices, an insulating gap of 0.070 in. or less between the two conductive lands and the combined widths of the lands and the insulating gap are at least 0.130 in. or more is required. Multiple variations of circuit land and gap patterns base on the above mentioned concept can then be combined on a common printed circuit structure to provide a prototyping breadboard if so desired. Three terminal devices can also be accommodated by designing land patterns comprised of two or more parallel and one or more perpendicular conductive circuit lands with the insulating gaps between the lands.

In both the above descriptions of mounting structures for two or three terminal devices it is important to consider that wide ranges of devices can be provided for by changing the dimensions of the circuit land and gap design according to the size of footprint range desired. The concept of the present invention is also applicable to devices having more than three terminal, but the practicality of the invention may become limited above four or six terminals or connection points on a driven device.

The foregoing and other objects, features and advantages of the invention will be apparent from the following more particular description of the preferred embodiments of the invention, as illustrated in the accompanying drawings.

DETAILED DESCRIPTION

Figure 1:
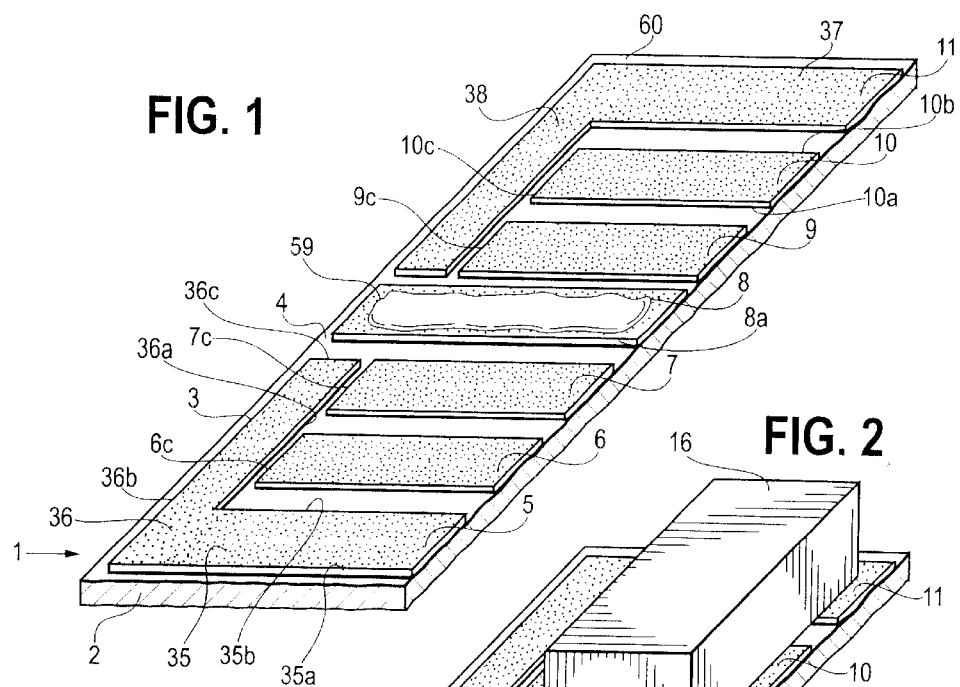
FIG. 1 is a perspective view of one possible circuit pattern on a circuit board embodying the present invention showing a combination of circuit land and gap structures designed for both two and three terminal components.

FIG. 1 as shown in the drawings a preferred universal component mounting structure for surface mountable electronic devices in accordance with the present invention is comprised of substantially planar rigid circuit board or circuit wafer 1 which is in the form of an insulating base substrate 2 onto which electrically conductive circuit patterns or lands 3 have been applied to the surface 60 thereof. The present invention can be a conventional circuit board or could instead be fabricated from ceramic or glass substrate materials and the circuit patterns could be applied using a cement material or a metallization selectively deposited. The substrate could also be in the form of a plastic, fiberboard, or other insulating material with the conductive circuit lands applied by screen printing a conductive ink.

Now referring back to FIG. 1 we see that the circuit patterns or lands 3 are separated by gaps or spaces 4 which are not electrically conductive. The gaps between the lands 3 form areas across which surface mount electronic components may be mounted. The size or footprint of the surface mount device which can be mounted in a given location being determined by the attachment footprint requirement for that given device. A footprint is comprised of two or more attachment points or pads that are needed to complete the connection of the component into a circuit or circuit element. One of the utilities of the Universal mounting structure described herein is a circuit land And gap pattern that is configured so that a variety of surface mount component types, styles, and sizes can be mounted and electrical connection to the circuit land areas can still be provided. It should be understood that within the context of the present invention that the circuit land and gap patterns can be designed in a variety of configurations so as to be most Compatible with a given family or families of devices, a family of devices being categorized by their mounting footprint requirements and the number of terminal or connection points needed to form completed circuits between the device being mounted and the universal mounting structure of the present invention. For the purpose of this discussion two or more electronic devices belong to the same family if their footprints have the same number of terminals and the terminals of each are configured in the same geometric relationship to each other such that the footprints differ only in the spacings between the terminals thereof.

It should be further understood that within the context of the present invention that the shape, size, and arrangement of the circuit land and gap patterns can be designed so as to provide a variety of differing interconnection points for the surface mount devices at the discretion of the circuit designer. Now referring to FIG. 1 observe several circuit land patterns applied to the insulating substrate numbered 5, 6, 7, 8, 9, 10, and 11. It can be seen that the arrangement of circuit pattern 5 forms an L shape of which one extension is located near circuit patterns 6 and 7. The circuit patterns 5, 6, and 7 is useable as a mounting zone for three terminal surface mount devices of varying sizes and footprints. The mounting area or zone thus formed can be used to mount three terminal devices or can alternatively be used to attach two terminal devices across Circuit land 5 and 6 or across 5 and 7, or both 5 and 6 and 5 and 7 if desired. Circuit lands 9, 10 and 11 form another mounting zone for three terminal devices similar to the above described mounting zone. Two terminal devices can be mounted anywhere across the gaps between circuit lands 5 and 6, 6 and 7, 7 and 8, 8 and 9, 9 and 10, and 10 and 11. The smallest device which can be mounted in any one location is determined by the gap width at that point. The largest device that can be mounted in any one location is determined by the combined width of the two circuit land patterns and the gap that they adjoin. It should be realized that the minimum and maximum dimensions of mounting footprints available in a given location for a component regardless of the number of device terminals, must provide sufficient interface with the circuit land patterns and the device terminals to complete an electrical circuit.

Figure 2:
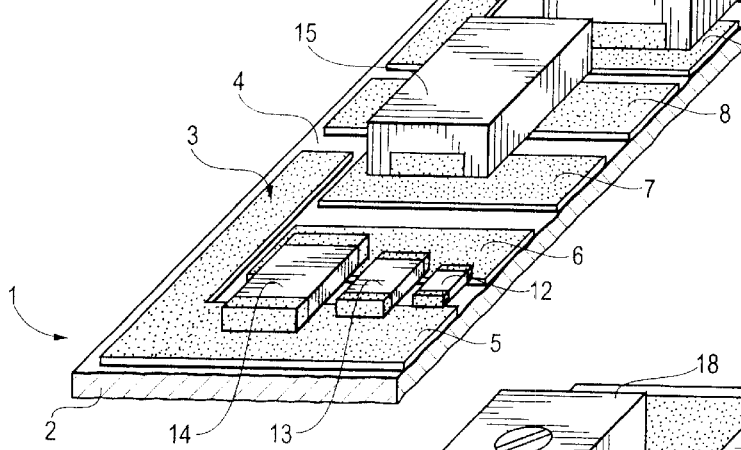
FIG. 2 is a perspective view of the same pattern shown in FIG. 1 with two terminal components of differing sizes shown attached.
Figure 3:
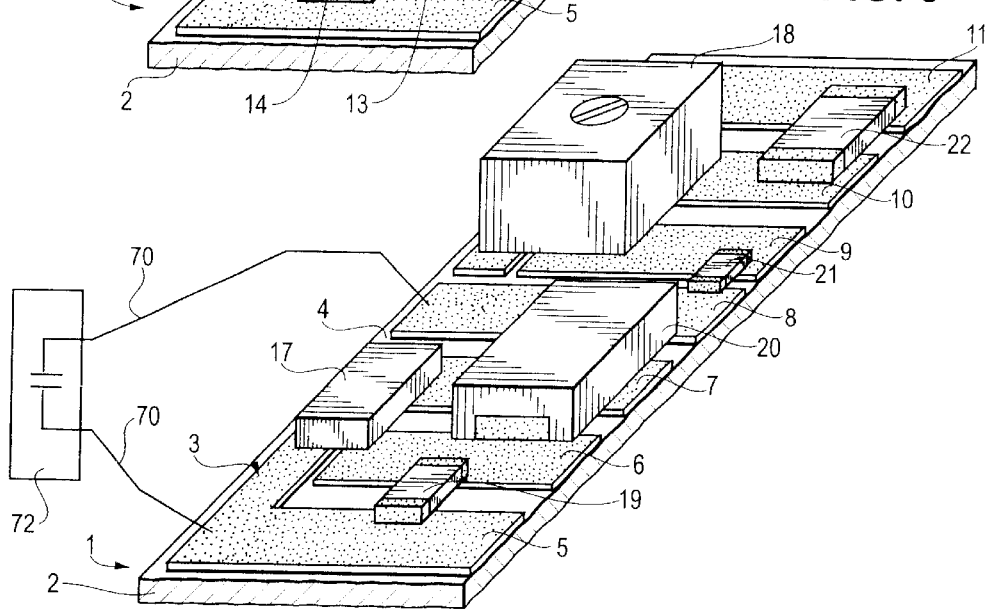
FIG. 3 is a perspective view of the same pattern as shown in FIG. 1 with two and three terminal devices shown attached.

Before describing in detail the component mounting examples show in FIG. 2 and FIG. 3 it should be understood that a variety of methods can be used to attach components to the universal mounting structure for surface mountable devices and provide for electrical connection of device terminals to the circuit lands.

Soldering of the connection points or the use of electrically conductive adhesives on the connection points would be common methods. The use of thermocompression bonding or welding methods may also be applicable. Another method would be to coat the top surfaces of the circuit land patterns with a heat activated electrically conductive layer of adhesive 59 that would both secure devices in place which providing electrical connection.

Now refer to FIG. 2 where a circuit pattern identical to figure one is shown where two terminal surface mount devices of several sizes are shown attached. Device 12 has a mounting footprint requirement of 0.080×0.050 in., device 13 has a footprint of 0.120×0.060 in., and device 14 has a footprint of 0.120×0.180 in. respectively. Notice that devices 12, 13 and 14 all belong to the same family and all have mounting footprints that can be accepted by the mounting zone formed by circuit lands 5 and 6 and the insulating gap between them. It should be noted that component mounting zones are not limited to adjoining circuit lands. The components 15 and 16 are examples of devices that are too large to be mounted across adjacent lands, but are instead mounted by bridging the intervening circuit land without making electrical connection to it. The terminals of device 16 are electrically connected to circuit lands 9 and 11 and do not connect to circuit land 10. The bridge mounting method described herein is possible without causing a short circuit because the bodies of surface mount devices are usually made of insulating materials. Device 15 is another example of the above described mounting method except that the body size and mounting footprint requirement is smaller than device 16, but is still accommodated by using the bridge mounting method.

Now note that devices 15 and 16 both share a common mounting one on circuit land 9. For the purposes of this discussion, the members of a family of devices will be said to be receivable on a "common circuit land" where all the members of the family are mountable on the circuit lands of the substrate and the designated common circuit land would be employed for the mounting of every member of the family. The sharing of mounting zones by devices used together in a particular circuit configuration is another feature of the present invention that provides utility in that it increases the circuit designers options for selecting both device sizes and interconnection locations.

FIG. 3 depicts another example of an assembly built on the universal mounting structure of the present invention that now includes three terminal devices 17 and 18. As can be seen the mounting zones for three terminal devices described above are used to attach these devices of different size and mounting footprint requirements. Device 17 represents a typical surface mount transistor and device 18 represents a typical surface mount control or potentiometer. It can be seen that the mounting footprint of device 18 is larger than device 17 but is still accommodated by the three terminal mounting zones described above. Devices 19, 20, 21, and 22 are two terminal components of the same family and are shown for size comparison with devices 17 and 18 and to demonstrate an example of the present invention which combines two and three terminal devices on the same assembly.

To more clearly demonstrate the universal mounting structures of the present invention mentioned above now refer to FIG. 4 which is an enlarged sectional top view showing the outlines of some typical footprints for two terminal devices shown superimposed over a typical circuit land and gap pattern. The footprints 26, 27, 28 and 29 are arranged so that any one of the devices may be mounted on the circuit land patterns shown. can be seen that devices having footprints 26, 27 and 28 all can be mounted within the same common mounting zone formed across circuit lands 24 and 25. A device having footprint 29 can be mounted across circuit land 23 and 25 and bridges circuit land 24 without making electrical connection. Devices with larger or smaller footprints can be used other than those pictured and larger devices can bridge more than one circuit land pattern if required.

Figure 5:
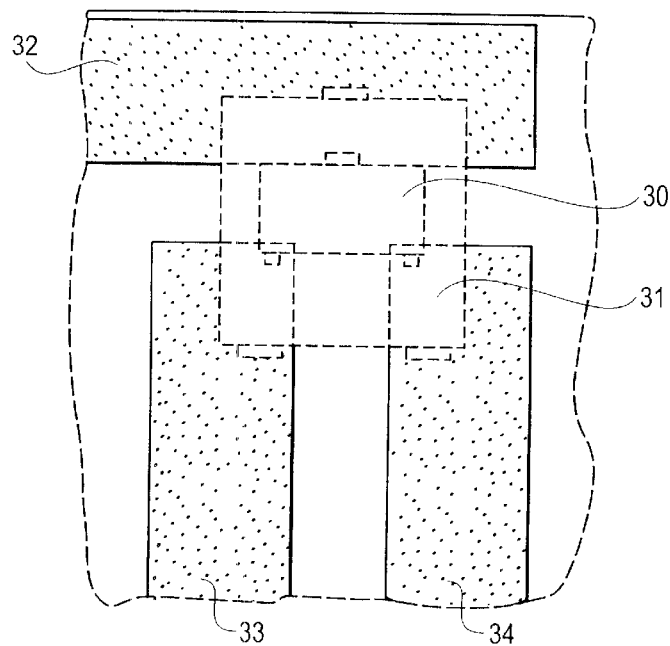
FIG. 5 is an enlarged fragmentary top view of typical mounting zone arrangements for three terminal devices.

Now refer to FIG. 5 which is also an enlarged fragmentary top view showing the outlines of some footprints for three terminal devices superimposed over a typical three terminal universal circuit land mounting zone arrangement as described above. The devices that have footprints 30 or 31 have three terminals,one of each connecting to mounting zones on circuit lands 32, 33 and 34.

The universal circuit land arrangement shown in FIG. 5 can provide multiple mounting zones for three terminal devices of different sizes and mounting footprint requirement. Any three terminal device that has a size and terminal arrangement that can interface with mounting zones on circuit lands 32, 33 and 34 and make electrical connection can be mounted if the circuit designer so desires.

Figure 4:
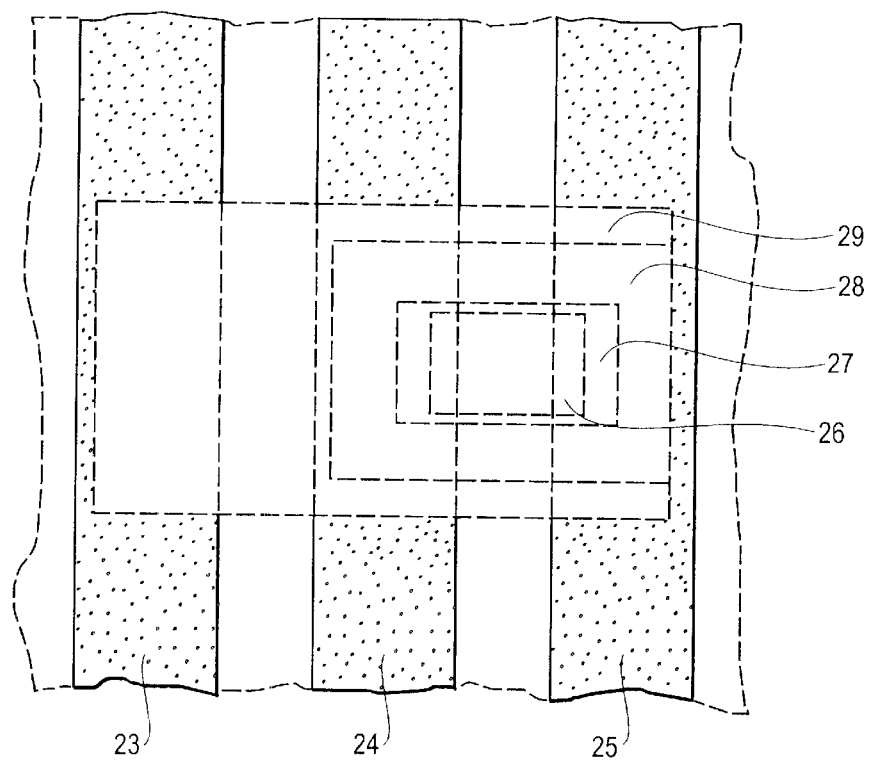
FIG. 4 is an enlarged fragmentary top view of typical mounting zone arrangements for two terminal devices.
Figure 7:
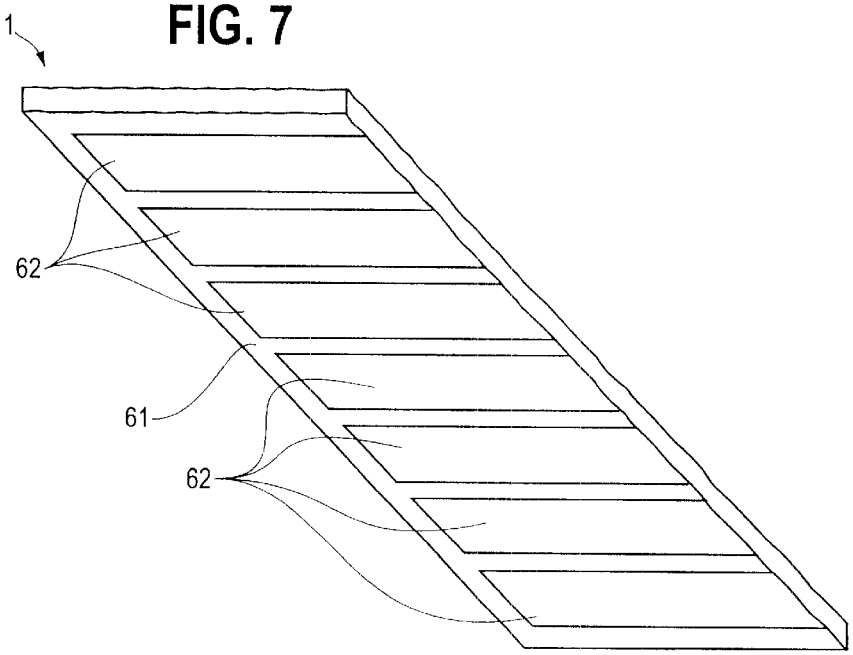
FIG. 7 is a perspective view of the bottom surface of the circuit board shown in FIG. 1.

In order to make the size relationship of the universal mounting structure for surface mountable electronic devices and the components and footprints for said components described herein more clear refer to FIG. 4. Component footprint 26 is 0.080×0.050 in.; footprint 27 is 0.120×0.060 in; footprint 28 is 120×0.180 in.; and footprint 29 is 0.300× 0.160 in. The component mounting footprints and the sizes described herein are for reference and do not represent all the possible component mounting arrangements possible with the context of the present invention. For example, conductive circuit patterns or lands can be applied to both sides of the circuit board, circuit wafer, or substrate in order to provide component mounting areas or zones on both sides, FIG. 7 shows a lower surface as having a pattern of lands 61 on the surface 62 thereof. The circuit pattern land and gap arrangements can be modified to accept the mounting of a variety of devices other than those shown and described herein. The circuit land and gap arrangement can be modified to provide larger or smaller areas at the discretion of the circuit designer depending on the number and type of surface mount components that are to be applied to the universal mounting structure of the present invention. The universal mounting structure for surface mountable electronic devices of the present invention can be combined with other dedicated or custom circuit designs in order to provide a surface mount component breadboarding area in adjunct to the dedicated or custom circuitry, with said combination not limited to any given type of custom or dedicated circuit design and not limited to any one component mounting technology including leaded devices or surface mount devices.

Referring further to FIG. 1, circuit land 10 has a generally rectangular shape with two substantially parallel long edges 10a, lob, and between the edges 10a, 10b a substantially planar surface coated with an electrically conductive material suitable for attachment to terminals of surface mount components, as described above. Circuit land 10 also has a short edge 10c, which is generally perpendicular to the long edges 10a, 10b, such that the long edges 10a, 10b define the length of a mounting zone and short edge 10c defines the width of a mounting zone to which the terminal of a component may be attached. As can be seen, circuit lands 6, 7, 8 and 9 also have generally rectangular shaped mounting zones with long edges define their lengths and substantially perpendicular short edges defining their width. The rectangular mounting zones of lands 6, 7, 8, 9 and 10 are arranged in side by side relationship with the long edges of each parallel to one another and each mounting zone is spaced from the long edge of the adjacent mounting zone.

Short edges 6c, 7c, 9c, 10c of the mounting zones on land 6, 7, 9, 10 respectively are linearly aligned with each other whereas the mounting zone of land 8 substantially extends across the circuit board 1. The mounting zone of circuit land 5 consists of first and second elongate sections 35, 36 respectively joined with the long edges 36a, 36b of the second section 36 connecting generally perpendicularly to the long edges 35a 35b respectively of the first section 35 to form an L configuration. The long edges 35a 35b of the first section 35 are also generally parallel with the long edges of the rectangularly shaped mounting zones of lands 6, 7, 8, 9 10 such that the first section 35 is oriented in side by side Relationship to the rectangular mounting zones of lands 6, 7, 8, 9 and 10.

The long edges 36a, 36b of the second section 36 of the mounting zone on land 5 extends substantially parallel along the short edges 6c, 7c of the mounting zones for lands 6 and 7 and is spaced approximately the same distance from each. The short edge 36c of section 36, which defines the width of section 36, is parallel to long parallel edge 8a of the mounting zone of land 8 and spaced a short distant therefrom. The mounting zone of circuit land 11 is shaped similar to that of circuit land 5 with a first rectangular section 37 in side by side relationship with the second rectangular section 38 extending along the short edges 9c, 10c of the mounting zones of lands 9 and 10.

One example of the combined application of the present invention with custom or dedicated circuitry described above might include a circuit designed and built using conventional means such as a standard circuit board which could be either single sided, double sided, or of a multilayer type of construction. The custom or dedicated circuitry for a given electronic circuit application would be applied to the board or substrate, and then would include a universal mounting structure for surface mountable electronic devices as described herein as part of the overall pattern applied to the board or substrate for the purpose of providing a prototyping, breadboarding, circuit modification, or test area in adjunct to the dedicated or custom circuit that would permit the use of surface mount devices in the combined application described above. The custom or dedicated circuitry mentioned above could be designed using any component technology the circuit designer may desire, and the universal mounting structure of the present invention which is combined with it can be designed in a variety of configuration within the context of the present invention as described above.

As shown in FIG. 3, interconnection of other circuits to the universal mounting structure for surface mountable electronic devices in any of its possible configuration within the context of the present invention described above can take a variety of forms. The wires 70, leads, terminal, or other electrically conducting objects of other circuits 72 that are to be connected can be soldered directly to the circuit lands, or could be attached by bonding to the circuit lands with conductive adhesives or by the use of welding. Any means that provide an electrical connection that meets the requirements of the circuit designer would be appropriate. Another method of interconnection would be the use of a socket or edge card connector, in which case the present invention could be modified so as to have one or more edges provided with a circuit pattern that can interface with said socket or connector.

Figure 6:
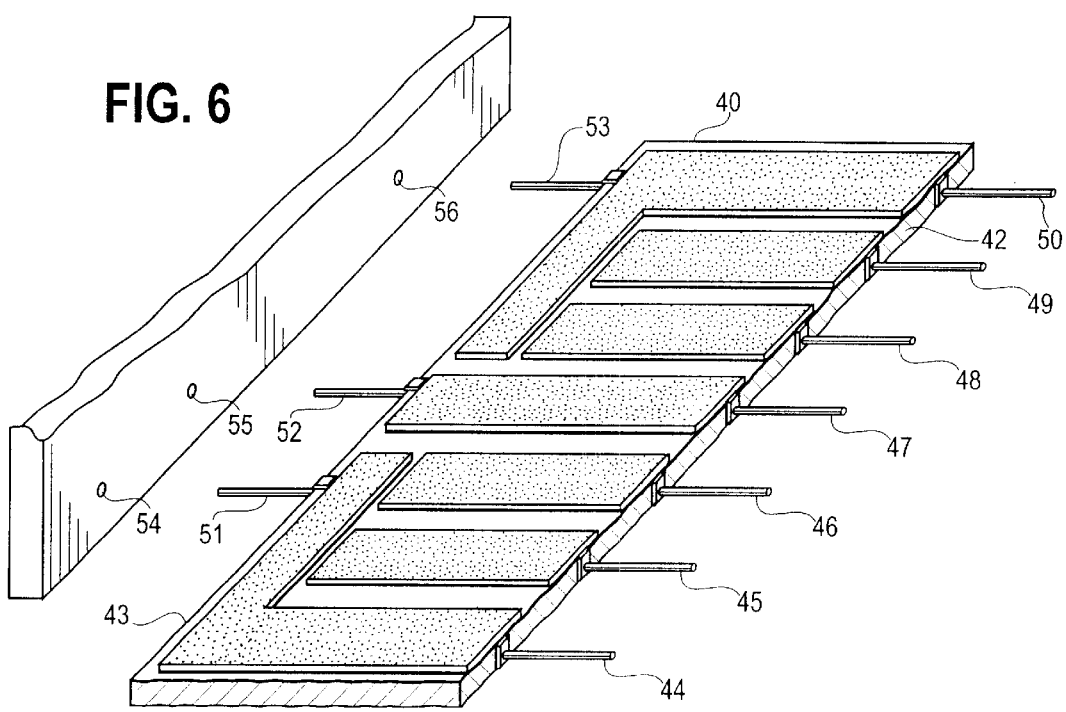
FIG. 6 is a perspective view of a circuit board similar to that shown in FIG. 1 having a plurality of pins extending from two sides thereof.

Another possible means of interconnection to the universal mounting structure for surface mountable electronic devices of the present invention would be the use of pins or leads attached to one or more sides thus allowing an assembly built using the present invention to be plugged into a socket, or inserted into a hole pattern on another circuit board and soldered in place in order to provide electrical connection. As shown in FIG. 6, a circuit board 40, or substrate designed within the context of the present invention can have provision made as part of its design to accept pins 44 to 52 along one or more sides 42, 43 to provide a single in line package or a dual in line package. It would also be possible to have other arrangements of pins including but not limited to four sides, or an arrangement that could polarize the package allowing it to be plugged in the socket or hole pattern in only one fashion, as shown by holes 54, 55, 56 in a receiving board 57. When the universal mounting structure for surface mountable electronic devices within the context of present invention is provided in the form of circuit boards or circuit wafers having the above described pins attached on one or more sides the circuit designer is provided with the utility of being able to build breadboarded prototypes of surface mount based circuit designs and then conveniently plug them into a socket or solderless breadboard for interconnection to other circuits for test and evaluation. The present invention may also be utilized to produce circuits in production qualities if so desired and the use of any of the interconnection means described above could be of value in that many of them provide the means of testing circuits prior to final installation by the use of sockets, plugs, and connectors that can provide a temporary means of interconnection prior to permanent installation of assemblies based on the present invention described above. In the context of the above description for interconnection and of the present invention one form of the present invention would be universal surface mount prototype boards having pins pre-installed and made Available to circuit designers such as circuit board 40.

It should now be apparent by the illustrations, descriptions, and examples given above that the present invention provides a universal mounting structure for surface mountable electronic devices that provides for the mounting of surface mount components having two or more terminals, and that provides for the mounting and interconnection of devices of varying size or footprint requirements, and that allows multiple device placement location options to the circuit designer.

It should also now be apparent that the universal mounting structure for surface mountable devices described herein can take many forms and still provide the features described above consistent with the scope and context of the present invention.

It should now further be apparent that the universal mounting structure for surface mountable devices of the present invention can be combined with other circuitry in a variety of configurations and remain consistent with the scope and context of the purpose of the present invention.

The present invention fulfills the need of circuit designers who wish to use surface mount components and provides a convenient means to prototype, breadboard, test and evaluate circuits or to produce circuits without the need to design and produce custom circuit patterns for circuit boards or circuit wafers.

The foregoing description of the preferred embodiment of the invention has been presented for the purposes of illustration and description. It is not intended to be exhaustive or to limit the invention to the precise from disclosed. Many modifications and Variations are possible in light of the above teaching. It is intended that the scope of the invention be limited not by this detailed description, but rather by the claims appended hereto.

What is claimed:

1. A method of connecting a surface mount device into an electronic circuit where said device has a footprint of contacts of a given size and is a member of a given family of devices, the method comprising the steps of:

providing a mounting structure comprising
   a rigid planar insulating substrate having a first surface,
   a plurality of electrically conductive circuit lands on said first surface,
   each of said circuit lands having dimension defining a length and a width, and said circuit lands having a spacing from one another,
   said dimension of said circuit lands and said spacing between said circuit lands and said spacings between said circuit lands sized for receiving said contacts of surface mount components having a plurality of sizes of footprints for said given family of devices for attachment to said circuit lands, with at least one of said circuit lands sized to receive one of said contacts for the mounting of all of said plurality of sizes of devices, said plurality of sizes of footprints including said given size,
   connecting said surface mount device to said circuit lands of said mounting structure, and connecting said mounting structure into said circuit.

2. The method of connecting a surface mount device into an electronic circuit where said device has a footprint of a given size and said device is a member of a given family of devices having a given number of contacts the method comprising the steps of:

providing a mounting structure comprising
   a rigid planar insulating substrate having a first surface,
   a plurality of electrically conductive circuit lands on said first surface,
   said plurality of electrically conductive circuit lands equal in number to said given number of contacts,
   each of said plurality of circuit lands having dimensions defining a length and a width, and said plurality of circuit lands having a spacing from one another,
   said dimensions of said plurality of circuit lands and said spacings between said plurality of circuit lands sized for receiving surface mount devices having a plurality of sizes of footprints of said given family, including said footprint of said given size, for attachment to said plurality of circuit lands,
   connecting said surface mount device to said plurality of circuit lands of said mounting structure, and
   connecting said mounting structure into said circuit.

3. The method of connecting a surface mount device into an electronic circuit where said device has a footprint of a given size and is a member of a given family of devices, where a family consists of devices having the same number of terminals and said terminals are configured in the same geometric relationship to each other with the footprints thereof differing only in the spacings between the terminals thereof, the method comprising the steps of providing a mounting structure comprising
   a rigid planar insulating substrate having a first surface,
   a plurality of electrically conductive circuit lands on said first surface,
   each of said circuit lands having dimension defining a length and a width, and said circuit lands having a spacing from one another,
   said dimension of said circuit lands and said spacings between said circuit lands sized for receiving surface mount components having a plurality of sizes of footprints for said given family of devices for attachment to said circuit lands, with at least one of said circuit lands sized to receive a terminal for each member of the said family of devices mountable on said plurality of circuit lands, said plurality of sizes of footprints including said given size, and
   connecting said surface mount device to said circuit lands of said mounting structure, and connecting said mounting structure into said circuit.

4. The method of claim 3 where said mounting structure is connected into said circuit by connecting said leads to said circuit of said mounting structure.

5. The method of claim 3 wherein
   said planar substrate has a first side, and a plurality of conductive pins extend from said first side, said pins electrically connected to said circuit lands, and said method further including the step of
   connecting said mounting structure into a circuit by inserting said pins into sockets therefor.

6. The method of connecting a surface mount device into an electronic circuit where said device has a footprint of a given size and said device is a member of a given family of devices having a given number of terminals, where a family consists of devices having the same number of terminals and the terminals are configured in the same geometric relationship to each other with the footprints thereof differing only in the spacings between the terminals thereof, the method comprising the steps of providing a mounting structure comprising
   a rigid planar insulating substrate having a first surface,
   a plurality of electrically conductive circuit lands on said first surface,
   said plurality of electrically conductive circuit lands equal in number to said given number of terminals,
   each of said circuit lands having dimensions defining a length and a width, and said circuit lands having a spacing from one another,
   said dimension of said plurality of circuit lands and said spacings between said plurality of circuit lands sized for receiving surface mount devices having a plurality of sizes of footprints of said given family, including said footprint of said given size, for attachment to said plurality of circuit lands,
   connecting said surface mount device to said plurality of circuit lands of said mounting structure, and
   connecting said mounting structure into said circuit.

* * * * *

UNITED STATES PATENT AND TRADEMARK OFFICE
CERTIFICATE OF CORRECTION

PATENT NO. : 6,467,163 B1
DATED : October 22, 2002
INVENTOR(S) : Robert A. Laschinski It is certified that error appears in the above-identified patent and that said Letters Patent is hereby corrected as shown below:

Column 8,
Line 35, beginning of the line, delete "and"

Column 9,
Lines 18 and 19, after "and" delete "said spacing between said circuit lands and".

Signed and Sealed this

Thirteenth Day of May, 2003

JAMES E. ROGAN
*Director of the United States Patent and Trademark Office*